United States Patent [19]

Ackerman

[11] Patent Number: 5,256,244
[45] Date of Patent: Oct. 26, 1993

[54] PRODUCTION OF DIFFUSE REFLECTIVE COATINGS BY ATOMIC LAYER EPITAXY

[75] Inventor: John F. Ackerman, Cheyenne, Wyo.

[73] Assignee: General Electric Company, Schenectady, N.Y.

[21] Appl. No.: 833,234

[22] Filed: Feb. 10, 1992

[51] Int. Cl.$^5$ .............................. C30B 25/04
[52] U.S. Cl. .................. 156/613; 156/614; 427/253; 427/294; 427/296
[58] Field of Search ............. 156/600, 603, 612, 613, 156/614; 427/294, 296, 253

[56] References Cited

U.S. PATENT DOCUMENTS 3,892,490  7/1975  Ueksuki et al. ............... 156/601
4,534,820  8/1985  Mori et al. ..................... 156/603

OTHER PUBLICATIONS

Goodman et al., J. Appl. Phys., 60(3) R65-R81 (1986).
Denbaars et al., J. Crys. Growth, 93, 195-200 (1988).
"Formation and Structure of titanium oxide layers on the surface of tantalum"; Ezhovskii et al., Izv. Akad. Nauk SSSR, Neorg. Mater., 20(2), pp. 253-256; (1984).
"Formation of titanium oxides on Silicon dioxide"; Scheschinskii et al.; Wiss. Z.-Friedrich-Schiller-Univ. Jena, Math-Naturwiss. Reihe, 28(5-6), pp. 659-666; (1978).

Primary Examiner—Olik Chaudhuri
Assistant Examiner—Felisa Garrett
Attorney, Agent, or Firm—William H. Pittman

[57] ABSTRACT

Diffusely reflecting metal oxide, preferably titanium dioxide, coatings are prepared on substrates by atomic layer epitaxy. Successive pulses of a hydrolyzable metal chloride and water are introduced at pressures in the range of about 180-1250 and about 150-650 millitorr, respectively, the pulse length being effective to produce a coating with an average thickness of about 15-25 Ångstroms during a single pulse pair.

6 Claims, No Drawings

PRODUCTION OF DIFFUSE REFLECTIVE COATINGS BY ATOMIC LAYER EPITAXY

This invention relates to the reflection of light, and more particularly to the preparation of diffuse reflectors.

In various types of light-transmitting apparatus, it is desirable or necessary to employ reflecting elements which reflect in a diffuse rather than a specular manner. By "diffuse" reflection is meant scattering of light, as opposed to "specular" reflection which is mirror-like in nature and is often imagewise. The efficiency of diffuse reflection is generally much greater than that of specular reflection, which is typically accompanied by absorption of a substantial fraction of the incident light.

Diffuse reflection is of particular importance in the area of medical imaging, as illustrated by X-ray imaging. Incident X-ray energy is converted by scintillators to light which is then detected by an array of silicon photodetectors. Since the photodetectors are very inefficient, it is important to maximize light emission. This is generally achieved by surrounding the scintillators with reflective material, often preferably capable of diffuse reflection. Various types of lighting apparatus also employ diffuse reflection.

One method for the production of diffuse reflectors involves physical vapor deposition of a suitable metal oxide such as magnesium oxide or titanium dioxide onto a metallic substrate, typically of aluminum. This method suffers from various disadvantages including lack of reproducibility, poor thickness uniformity and poor adhesion of the oxide to the substrate.

In another method, the metal oxide is dispersed in a gel-like material, coated on metal foil and wrapped by hand around the scintillator or other light-transmitting unit. This manual process is very inefficient and expensive.

It is apparent, therefore, that an improved method for fabricating diffuse reflectors which is substantially free from these deficiencies is desirable. The present invention provides such a method, which is capable of operation in a reliable manner to afford uniform and reproducible products. The reflecting layers in said articles are strongly adherent to the substrate surface on which they are deposited. Moreover, the method is capable of operation at relatively low temperatures and relatively high pressures, thus facilitating the coating of numerous readily available materials including thermoplastics.

In one of its aspects, the invention is a method for depositing on a substrate a metal oxide coating which reflects light diffusely, which comprises subjecting said substrate to alternating feed pulses of a hydrolyzable chloride of said metal and of water at pressures in the range of about 180–1250 and about 150–650 millitorr respectively, with evacuation of the deposition system to a pressure in the range of about 80–100 millitorr between successive pulses; the pulse length being effective to produce a metal oxide layer with an average thickness of about 15–25 Ångstroms during a single pulse pair and the number of pulse pairs being effective to produce a coating with a thickness in the range of about 2–50 microns.

The substrates which may be treated by the method of this invention are diverse in character. They include metals, ceramics and resinous materials. The method is particularly adaptable for coating thermoplastics such as polycarbonate, polytetrafluoroethylene and polyethylene.

The coating method employed according to this invention is atomic layer epitaxy (hereinafter "ALE"), as described in Goodman et al., *J. Appl. Phys.*, 60 (3), R65–R81 (1986), and in Denbaars et al., *J. Crys. Growth*, 93, 195–200 (1988). In ALE as normally practiced, a first reactive species is contacted with a substrate in a reduced pressure environment, under conditions which promote adhesion of siad first reactive species by chemisorption but which suppresses adhesion by physisorption. As a result, a monoatomic or monomolecular layer (hereinafter sometimes simply "monolayer") of the first reactive species is deposited. Upon introduction of a material (hereinafter sometimes "second reactive species") which reacts with the first reactive species, the monolayer is converted to a product monolayer upon which further first and second reactive species can be alternately deposited. Thus, successive pulses of the two reactive species are introduced and the result is a series of monolayers having strong adhesion to the substrate and a high degree of integrity.

According to the present invention, the first reactive species is a hydrolyzable metal chloride. Examples of suitable materials are titanium tetrachloride and aluminum chloride. The second reactive species when this is the case is water, which hydrolyzes the metal chloride to a metal oxide such as titanium dioxide or aluminum oxide. The preferred metal for the production of diffusing reflecting coatings is titanium, produced by the hydrolysis of titanium tetrachloride. Frequent reference to titanium compounds will be made hereinafter; however, it should be understood that other metals may be substituted for titanium when appropriate.

It is also within the skill of the art to substitute for the metal chloride and water other materials when other types of coatings are desired. For example, a magnesium fluoride coating can be produced by employing biscyclopentadienylmagnesium and hydrogen fluoride.

Under conventional conditions, the pressures and temperatures employed in ALE are very low and very high, respectively. Pressures on the order of 100 millitorr and temperatures above 300° C. are typical.

The present invention, on the other hand, employs substantially higher pressures and lower temperatures. As a result, a plurality of monolayers rather than a single monolayer is produced by each pulse pair (i.e., one titanium tetrachloride pulse followed by one water pulse). The invention contemplates the production of about 1–6 titanium-containing monolayers, and preferably about 1–3, per pulse pair.

One result of the formation of multiple titanium-containing monolayers is the occurrence of a microcracking phenomenon within and between the monolayers. It is this phenomenon that results in the coating being diffuse rather than specular.

The monolayers are defined as "titanium-containing" rather than as titanium dioxide since both titanium dioxide and titanium tetrachloride, as well as transitory partial hydrolysis products of titanium tetrachloride, may be present at various locations during the ALE process. In a single pulse pair, the amount of water (which is the second reactive species) introduced in a single pulse pair is in excess of that required to hydrolyze the $TiCl_4$ introduced in the same pulse pair. The excess water forms a chemisorbed layer which hydrolyzes a portion of the $TiCl_4$ deposited in the next pulse pair.

The successive feed pulses of titanium tetrachloride and water are effected at pressures substantially higher than those ordinarily employed for ALE. The titanium tetrachloride pulses are at a pressure in the range of about 180-1250 millitorr and especially about 800-1200 millitorr. The water pulse pressure is generally about half that of the titanium tetrachloride pulses, most often about 150-650 and preferably about 400-600 millitorr. Typical pulse lengths are on the order of 1-5 seconds.

Reaction temperatures are usually in the range of about 80°-130° C. and preferably about 90°-110° C. Above 130° C., the coating produced may not adhere well to the substrate.

Under these conditions, the thickness of a titanium-containing layer deposited by a single pulse pair is generally in the range of about 15-25 Ångstroms. The total coating thickness desired is in the range of about 2-50 microns (about 20,000-500,000 Ångstroms). Thus, total coating times from about 2 hours to about 3 days or even greater are typical.

Titanium dioxide-coated articles produced by the method of this invention comprise a substrate having deposited thereon a coating which reflects light diffusely, said coating comprising titanium dioxide particles formed by microcracking of multiple titanium-containing layers of said particles, each of said layers comprising about 1-6 and preferably about 1-3 titanium-containing monolayers and the final coating having an average thickness in the range of about 2-50 microns. Such articles are another aspect of the invention.

The invention is illustrated by an example in which a bisphenol A polycarbonate plaque was placed in a stainless steel vessel of dimensions 45×30×30 cm., which was then evacuated to about 100 millitorr pressure and heated to 100° C. A pulse of titanium tetrachloride was introduced over 2 seconds at a pressure of 1000 millitorr, after which the vessel was again evacuated over 7 seconds. This was followed by introduction of a pulse of water at 400-500 millitorr, followed again by evacuation over 7 seconds. It was found upon analysis that a diffuse titanium dioxide monolayer with a thickness of 20 Ångstroms was deposited by each pulse pair. Additional pulse pairs were generated to a total titanium dioxide thickness in the range of 2-50 microns. The coating thus obtained was found to reflect light diffusely and to comprise titanium dioxide particles in a configuration resulting from the microcracking of the monolayers deposited.

Similar articles were obtained by the employment of polytetrafluoroethylene and polyethylene substrates. The same was true of an aluminum substrate, which was painted black to demonstrate the hiding power of the $TiO_2$ coating. A coating with uniform hiding power was obtained.

What is claimed is:

1. A method for depositing on a thermoplastic resin substrate a metal oxide coating which reflects light diffusely, which comprises subjecting said substrate to alternating feed pulses of a hydrolyzable chloride of said metal and of water at pressures in the range of about 180-1250 and about 150-650 millitorr respectively, with evacuation of the deposition system to a pressure in the range of about 80-100 millitorr between successive pulses; the pulse length being effective to produce a metal oxide layer with an average thickness of about 15-25 Ångstroms during a single pulse pair and the number of pulse pairs being effective to produce a coating with a thickness in the range of about 2-50 microns.

2. A method according to claim 1 wherein the metal chloride is titanium tetrachloride.

3. A method according to claim 2 wherein the pressures of the titanium tetrachloride and water pulses are about 800-1200 and about 400-600 millitorr, respectively.

4. A method according to claim 3 wherein the substrate is polycarbonate.

5. A method according to claim 3 wherein the substrate is polytetrafluoroethylene.

6. A method according to claim 3 wherein the substrate is polyethylene.

* * * * *